(12) United States Patent
Cheng

(10) Patent No.: US 11,525,864 B2
(45) Date of Patent: Dec. 13, 2022

(54) BATTERY MONITOR SYSTEM

(71) Applicant: PALCELLs Technology, Inc., Milpitas, CA (US)

(72) Inventor: Win Sheng Cheng, Cupertino, CA (US)

(73) Assignee: PALCELLs Technology, Inc., Milpitas, CA (US)

( * ) Notice: Subject to any disclaimer, the term of this patent is extended or adjusted under 35 U.S.C. 154(b) by 624 days.

(21) Appl. No.: 16/529,781

(22) Filed: Aug. 1, 2019

(65) Prior Publication Data

US 2021/0033677 A1 Feb. 4, 2021

(51) Int. Cl.
*G01R 31/3842* (2019.01)
*G01R 31/36* (2020.01)
*G01R 31/364* (2019.01)

(52) U.S. Cl.
CPC ....... *G01R 31/3842* (2019.01); *G01R 31/364* (2019.01); *G01R 31/3644* (2013.01)

(58) Field of Classification Search
None
See application file for complete search history.

(56) References Cited

U.S. PATENT DOCUMENTS

2020/0036058 A1\* 1/2020 van Lammeren ... H01M 10/486

\* cited by examiner

*Primary Examiner* — Jas A Sanghera
(74) *Attorney, Agent, or Firm* — Skaar Ulbrich Macari, P.A.

(57) ABSTRACT

In a DC impedance measurement routine for a battery the current load from a source is initially set to a low setting. The system waits for a set time in this state for the voltage readings to stabilize. Once the voltage is stable at the low current setting, the current setting is changed to a high value and the voltage is read quickly. Then the current load is set back to the low setting immediately after the reading is made. Several consecutive measurements are performed by repeating the steps above. A DC impedance measurement system that can be used to carry out the measurement routine. A multi-battery system can be monitored via a DC impedance measurement system and the routine being performed on each battery.

11 Claims, 3 Drawing Sheets

__US 11,525,864 B2__

BATTERY MONITOR SYSTEM

FIELD

The present invention relates generally to battery monitoring systems, and more particularly, to systems for monitoring backup batteries and charging components.

BACKGROUND

Monitoring battery health in a battery system is important for many implementations of battery systems. One measure of battery health is the direct current (DC) internal impedance value for a given battery.

Conventional DC impedance measurements use DC drain or dual pulsing current load and measure the voltage differences to determine the battery's internal impedance. However, there are drawbacks to these measurement methods. For example, a high drain current load must be used to get a reliable result when measuring low DC impedance such as would occur in a high capacity lead acid battery. Continuous pulses must be used to get a stable condition for measurement. During the measurement, the output voltage may drift and result in an unprecise and unwanted measurement. Thus, current solutions require complicated circuitry for obtaining the DC impedance measurement, which increase the device size and cost.

Therefore, there is a continuing need to provide for improved DC impedance measurement systems and methods.

SUMMARY

The present invention addresses the above-noted drawbacks of conventional DC impedance measurement systems and methods as completely as possible.

In one aspect, the invention provides the DC impedance measurement routine for a battery. The current load from a source is initially set to a low current setting. The system waits for a set time in this state for the voltage readings to stabilize. Once the voltage is stable at the low current setting, the current setting is changed to a high value and the output voltage is read quickly. Then the current load is set back to the low setting immediately after the reading is made. Several consecutive measurements are performed by repeating the steps above. Additional aspects are described below and illustrated in FIG. 2.

In another aspect, a DC impedance measurement system that can be used to carry out the measurement routine is disclosed as explained below and as shown in FIG. 1.

In a further aspect, a DC impedance measurement system for a multiple battery system is described below and illustrated in FIG. 3.

The disclosure includes a direct current (DC) impedance measurement routine for a battery. A current load from a source is set to a low current setting. The system waits for a period of time in the low current setting sufficient to allow voltage readings of the battery to stabilize. The current load is changed from the source from the low current setting to a high current setting. An output voltage of the battery is read while the current load from the source is set to the high current setting. Immediately after reading the output voltage of the battery while the current load from the source is set to the high current setting, the current load is set from the source back to the low current setting.

The steps of changing from the low current setting to a high current setting, reading an output voltage of the battery while the current load is set to the high current setting and immediately after reading the output voltage setting current load back to the low current setting can be repeated multiple times and an average of the multiple readings of the output voltage of the battery can be computed.

A DC linear voltage reference can be enabled and established before beginning the measurement method. The DC linear voltage reference can be disabled following the completion of the measurement method.

A current sensor can be coupled to an input to the battery and subtract out any current being supplied from a charger connected to the battery when performing the step of reading the output voltage of the battery while the current load is set to the high current setting.

The battery can comprise one cell or multiple battery cells.

The read output voltage of the battery can be wirelessly or wiredly relayed to a cloud computing system or a remotely-located computing system.

A negative voltage output from a multiplexer and resistor network connected to a positive terminal of the battery can be transformed to a positive value range.

The high current setting can be maintained only long enough to allow for the reading of the output voltage of the battery to be performed.

The disclosure further includes a DC impedance measurement system for a battery. A dual constant current source is electrically connected to both a positive terminal and a negative terminal of the battery. A multiplexer is electrically connected to the dual constant current source. A low-dropout (LDO) voltage regulator is electrically connected to the multiplexer to provide a DC linear voltage reference value through a voltage divider resistor network. A microcontroller is provided and includes an analog-to-digital converter (ADC). An operation amplifier is electrically connected to the multiplexer and to the microcontroller. The operational amplifier is configured to output voltage levels that can be read by the ADC of the microcontroller. A negative offset bias and bipolar power supply is electrically connected to the multiplexer and the dual constant current source and a negative input to the operational amplifier. The negative offset bias and bipolar power supply are configured to transform any negative output voltage from the multiplexer to a positive value range.

The output voltage level of the operational amplifier can be passed through a low pass filter before reaching an input of the ADC. A charger can be electrically connected to the battery. A clamp on current sensor can be coupled to a conduction wire between the charger and a positive terminal of the battery. A communication module can be connected to the microcontroller and configured to communicate data to a cloud or remote computing system.

The microcontroller can be configured to control the performance of the DC impedance measurement routine described herein.

Also disclosed is a monitor system for a multi-battery system comprising a plurality of batteries electrically connected in series. Provided is a system control/communication box. A master system board is coupled to one of the batteries. The master system board comprises a DC impedance measurement system as described herein and a dedicated microcontroller. The dedicated microcontroller is coupled to the system control/communication box. One or more slave boards are coupled to a respective one of each of the batteries that is not connected to the master system board. Each slave board comprises a DC impedance measurement system as described herein and an isolator. The master system board is coupled to the slave boards to acquire a voltage measurement result and route the voltage measurement result to the control/communication box.

The dedicated microcontroller can be configured to decide when battery information such as DC impedance, voltage or charging current will be measured.

The above summary is not intended to limit the scope of the invention, or describe each embodiment, aspect, implementation, feature or advantage of the invention. The detailed technology and preferred embodiments for the subject invention are described in the following paragraphs accompanying the appended drawings for people skilled in this field to well appreciate the features of the claimed invention. It is understood that the features mentioned hereinbefore and those to be commented on hereinafter may be used not only in the specified combinations, but also in other combinations or in isolation, without departing from the scope of the present invention.

Figure 1:
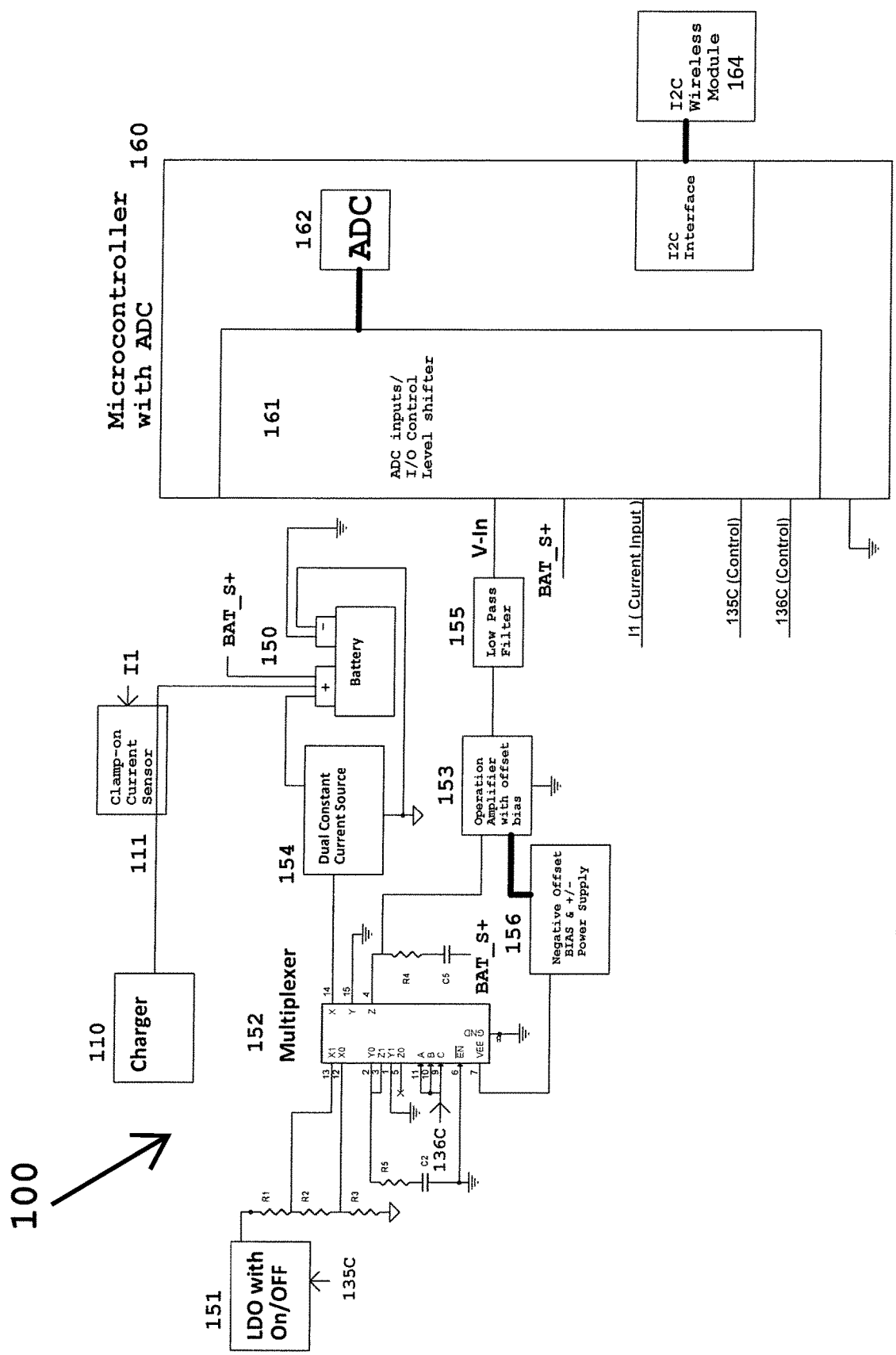
FIG. 1 is a diagram of a DC impedance measurement systems in accordance with an embodiment of the invention.

While the invention is amenable to various modifications and alternative forms, specifics thereof have been shown by way of example in the drawings and will be described in detail. It should be understood, however, that the intention is not to limit the invention to the particular example embodiments described. On the contrary, the invention is to cover all modifications, equivalents, and alternatives falling within the scope of the invention as defined by the appended claims.

DETAILED DESCRIPTION

In the following descriptions, the present invention will be explained with reference to various exemplary embodiments. Nevertheless, these embodiments are not intended to limit the present invention to any specific example, environment, application, or particular implementation described herein. Therefore, descriptions of these example embodiments are only provided for purpose of illustration rather than to limit the present invention.

Referring to FIG. 1, a DC impedance measurement system 100 and method 200 will now be described. The battery to be measured is designated by reference numeral 150.

A dual constant current source 154 is connected to the terminals of the battery 150. The dual constant current source 154 draws from the battery 150 to generate fixed current differences that will be used for the measurement process described below. For example a 0.1 Amp and a 10.1 Amp current can be provided as the low and high current settings, respectively. Of course other high and low current settings can be provided in other examples.

The output drain currents of the dual constant current source 154 are controlled via a multiplexer 152 which selects the required voltage reference based on the high and low current setting of the measurement. The battery voltage output, BAT_S+, resulting from differential pulsing drain current load is fed into the multiplexer 152 through a capacitor and resistor network to derive the differential voltage difference of high and low current ranges.

Also connected to multiplexer is a low-dropout or LDO voltage regulator 151 that provides a DC linear voltage reference. For example, a 2.5 Volt reference value is provided. Of course, other voltage values can be used in other examples. A resistor network is used as a voltage divider to decide the voltage reference and this voltage reference will be translated into current loads through dual constant current source 154.

A positive input of the operation amplifier 153 is also connected to the multiplexer 152 and resistor and capacitor network. The operation amplifier 153 provides sets of voltage outputs at the designed required current levels that can be read by the ADC 162 of the microcontroller 160 (typically in a voltage range 0V-5V for an ADC powered by 5V power supply). The output of the amplifier 153 is passed through a low pass filter 155 before reaching the ADC input 161 to the ADC 162. Note that normally there are many ADC inputs to be selected by ADC, but only the input from operation amplifier 153 is shown for simplicity.

A negative offset bias is generated by a resistor network and the negative voltage of the power supply. The positive/negative bipolar power supply 156 is used to power the multiplexer 152 and the dual constant current source 154. The negative offset bias is coupled to the negative input to the operation amplifier 153 to account for instances where the output voltage from the multiplexer 152 and the feedback resistor network connected to battery positive terminal goes negative. In such instances, the negative offset bias power supply 156 transforms that negative voltage to a positive value range. This ensures that a viable reading can be taken because negative voltage values input into the operation amplifier 153 may result in a negative output voltage which is invalid or will result in null DC impedance readings from ADC 162.

The operation amplifier 153 also can be used to set the proper gain which will depend on the DC impedance ranges of the target battery to be measured. For example, the voltage drop of 4 milliohm of DC impedance of a typical lead acid battery will be around 40 mV for 10 A DC current loading. Sometimes the voltage reading may be so small relative to the voltage range of the ADC that the gain of the operational amplifier must be sufficient to provide an output that can be accurately recognized by the ADC conversion.

The precise 2.5V reference voltage from the LDO 151 is used in operation to generate two constant current loads, low and high as described above. The voltage reference component 151 is only enabled when the DC impedance measurement is started. When the measurements are done, the voltage reference component 151 is disabled and there will be no reference voltage output and there will be no current load which means that no current will be generated. This greatly reduces the power consumption of the measurement system because the current load is the main power consumption of the measurement system.

The two different current loads are controlled and selected by the microcontroller 160 that is coupled to the multiplexer 152 through 136C from output of I/O control module of 161 inside 160 the microcontroller. For normal operation, LDO 151 is enabled by 135C from 161. Shortly after the enabling, the low current load is enabled for a fixed period of time and then high current load is enabled for a short period of time that is sufficient for ADC 162 to perform the measurement, and then the low current load is enabled again. This kind of cycle may be repeated 5-10 times until a stable result is acquired. Then the LDO 151 is disabled.

A charger 110 is connected to the battery 150. A clamp on current sensor 111 is coupled to the conduction wire between the positive terminal (BAT_S+) of the battery 150. The sensor 111 can be a clamp-on type, such as disclosed in U.S. Pat. No. 10,295,575, which is fully incorporated herein by reference as part of this application. The reading from the current sensor allows the Microcontroller to subtract out any current being supplied from the charger when performing the DC impedance measurement routine to avoid the error result.

A communication module 164 is shown connected to the microcontroller 160. The communication module 164 provides the communication to/from a cloud or remote computing system. The communication can be wired or wireless. The wireless protocol can be any conventional wireless means, including Wi-Fi, Cellular, Bluetooth, etc. The wired can be RS485 and RS232 or other communication protocols.

Figure 2:
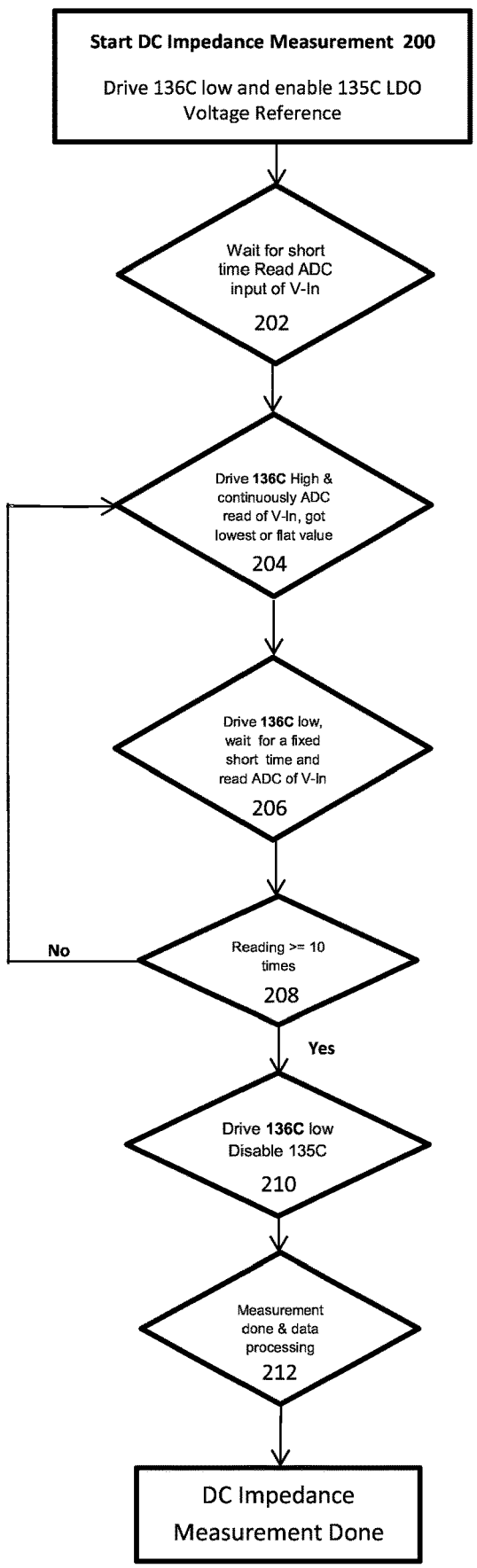
FIG. 2 is a flow chart of a DC impedance measurement method in accordance with an embodiment of the invention.

Referring now to FIG. 2, the DC impedance measurement routine for the battery 150 will now be described. At the start 200, the voltage reference from the LDO 151 is enabled via control 135C and the current load from the source 154 is set to the low setting via control 136C. The system waits for a set time in this state at 202 for the voltage readings (V-in) to stabilize as read by the microcontroller 160 via the ADC 162.

Once the voltage is stable at the low current setting, the current setting is changed to the high value 204 via control 136C and the voltage is read quickly (typically in the millisecond range depending on ADC setting). Then the current load is set back to the low setting 206 immediately after the reading is made. Several consecutive measurements are performed 208 by repeating the steps 204 and 206. The reference voltage from the LDO 151 is disabled following completion of the desired number of measurements 210.

The measurement data is processed in step 212. For example, the last two stable measurements are chosen and an average the measurements is tabulated for the final results.

The method and measurement system described herein possesses several advantages over conventional DC impedance measurement systems and methods. For example, the invention does not require high load current and no high power device is needed. The measurement circuitry is only powered on for a short period time (e.g. mere seconds in total) which greatly reduces battery power consumption. No cumbersome heatsink is needed because sustained high currents are not employed. The high current is only enabled for very short periods of time (e.g. about 100 milliseconds) which greatly reduces the power consumption. The measurement device therefore can be much smaller as compared to devices employing sustained high load current. In addition, the present circuitry and system can be easily adapted to various DC impedance ranges for various types of batteries by choosing proper current ranges and operation amplifier gain and proper negative BIAS voltage.

Figure 3:
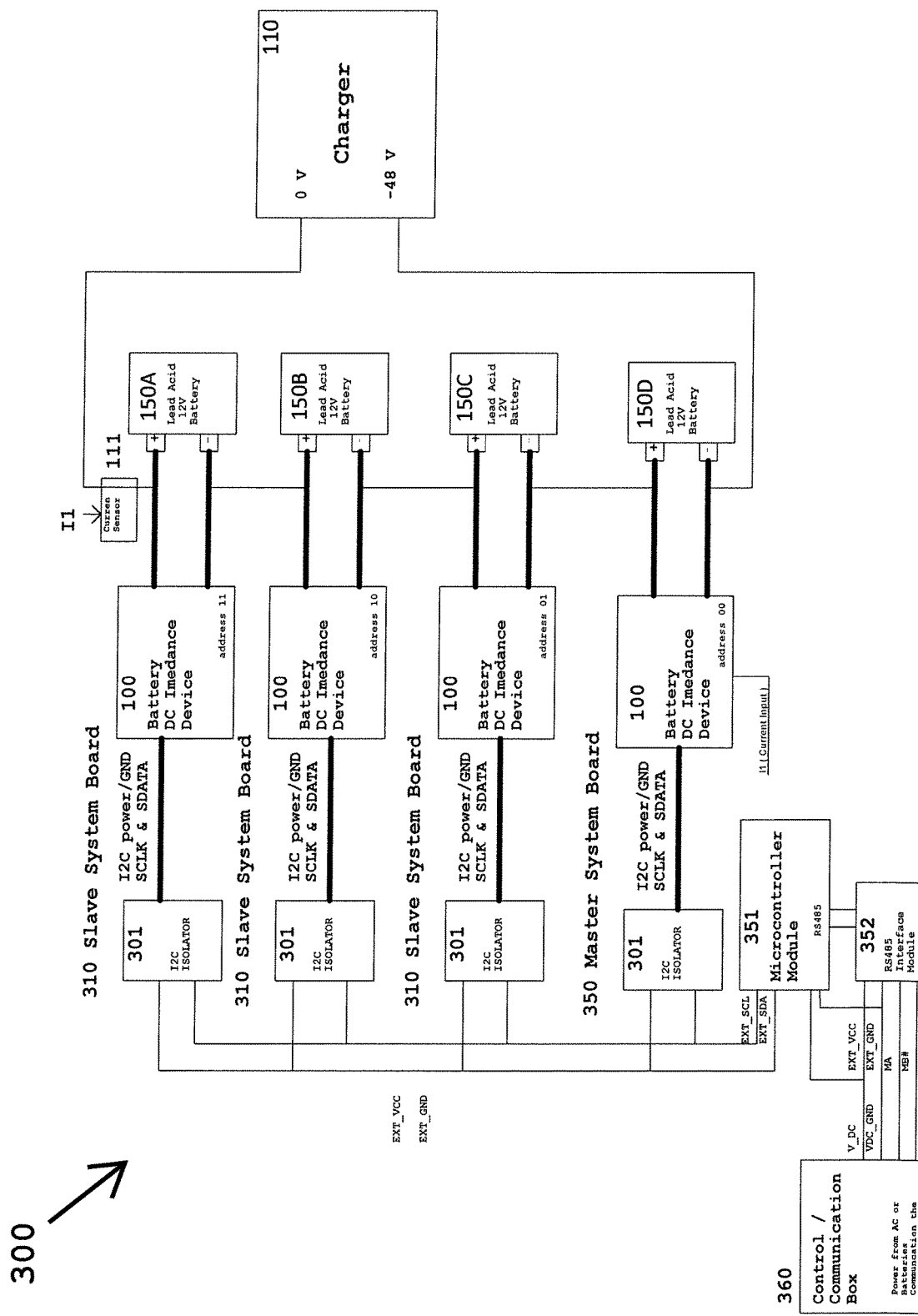
FIG. 3 is a diagram of a DC impedance measurement systems for a multiple battery system in accordance with an embodiment of the invention.

FIG. 3 shows an example of a multiple battery system 300 for a typical 48V Telecom station. There are four DC Impedance Measurement devices 100 corresponding to each of the four batteries 150A, 150B, 150C and 150D, respectively, that are wired in series.

There are two types of devices employed in this system: slave system board 310 and master system board 350. The slave boards 310 have designated addresses here of 01, 10 and 11 (indicated in the impedance device blocks 100). The master board 350 can access the slave boards 310 for the measurement results and route the measurement results to the control/communication box 360 when inquired. The control/communication box 360 will inquire or read the battery information through the master system board 350.

Each of the slave system boards 310 include a battery DC measurement device 100 and an I2C isolator 301. The isolator 301 will isolate the voltage level due to the battery being in series having a different voltage level.

The master system board 350 also includes a dedicated microcontroller module 351 which interface to the control and communication box through an RS485 Interface module 352. The dedicated microcontroller module 351 also acts as the controller to decide when the battery information such as DC impedance, voltage or charging current will be measured. All these measured data will be stored in local memory to be accessed or read by the Control/Communication box 360.

In some situations, the microcontroller in the master control board 350 also provide the same functions as the master microcontroller module of 351 to decide when the battery information such as DC impedance, voltage or charging current will be measured. But the data still will be stored inside 351 to be read by the Control/Communication box 360.

The control and communication box 360 is powered by the batteries in series or via AC power. The control box 360 routes the measured data back to the control room or to the cloud through Ethernet or through a wireless communication means.

The batteries discussed herein are 12V lead-acid type batteries. Alternate battery types with various chemistries can also be used according to the invention, such as various voltages of lead-acid batteries, and lithium-based batteries.

This invention can also be used in any battery power solution, in any backup battery, or battery system in a ship, RV, EV car, vehicle start-up battery, golf cart, and many more. In some applications, the application circuitry can be simplified to meet the requirements. The battery described here is for series connections but it can be expanded to more batteries in series to meet various applications.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products. Moreover, features or aspects of various example embodiments may be mixed and matched (even if such combination is not explicitly described herein) without departing from the scope of the invention.

What is claimed is:

1. A DC impedance measurement system for a battery, comprising:
   a dual constant current source electrically connected to both a positive terminal and a negative terminal of the battery;
   a multiplexer electrically connected to the dual constant current source;
   a low-dropout (LDO) voltage regulator electrically connected to the multiplexer to provide a DC linear voltage reference value;
   a microcontroller including an analog-to-digital converter (ADC);
   an operation amplifier electrically connected to the multiplexer and to the microcontroller, the operational amplifier configured to output voltage levels that can be read by the ADC of the microcontroller; and a negative offset bias and bipolar power supply electrically connected to the multiplexer and the dual constant current source and a negative input to the operational amplifier, the negative offset bias and bipolar power supply configured to transform any negative output voltage from the multiplexer to a positive value range.

2. The system of claim 1, wherein the output voltage level of the operational amplifier is passed through a low pass filter before reaching an input of the ADC.

3. The system of claim 1, further comprising:
a charger electrically connected to the battery; and
a clamp-on current sensor coupled to a conduction wire between the charger and a positive terminal of the battery.

4. The system of claim 1, further comprising a communication module connected to the microcontroller, the communication module configured to communicate data to a cloud or remote computing system.

5. The system of claim 1, wherein the microcontroller is configured to:
(a) set a current load from the dual constant current source to a low current setting;
(b) wait for a period of time in the low current setting sufficient to allow voltage readings of the battery to stabilize;
(c) change the current load from the dual constant current source from the low current setting to a high current setting;
(d) read an output voltage of the battery while the current load from the dual constant current source is set to the high current setting; and
(e) immediately after reading the output voltage of the battery while the current load from the dual constant current source is set to the high current setting, setting the current load from the dual constant current source back to the low current setting.

6. The system of claim 5, wherein the microcontroller is further configured to repeat steps (c) through (e) multiple times and compute an average of the multiple readings of the output voltage of the battery while the current load from the dual constant current source was set to either of the high current setting or the low current setting.

7. The system of claim 5, wherein the microcontroller is further configured to enable the LDO prior to step (a) and disable the LDO following step (e).

8. The system of claim 1, wherein the battery comprises multiple battery cells.

9. A monitor system for a multi-battery system comprising a plurality of batteries electrically connected in series, the monitor system comprising:
a system control/communication box;
a master system board electrically connected to one of the batteries, the master system board comprising a DC impedance measurement system according to claim 1 and a dedicated microcontroller, wherein the dedicated microcontroller is coupled to the system control/communication box; and
one or more slave boards, each of the slave boards electrically connected to a respective one of each of the batteries that is not connected to the master system board, each slave board comprising a DC impedance measurement system according to claim 1 and an isolator,
wherein the master system board is coupled to the slave boards to acquire a voltage measurement result and route the voltage measurement result to the system control/communication box.

10. The monitor system of claim 9, wherein the dedicated microcontroller is configured to decide when a battery information will be measured, wherein the battery information is at least one of a DC impedance, a voltage and a charging current.

11. The monitor system of claim 9, wherein the multi-battery system is a telecom station battery system.

\* \* \* \* \*